United States Patent
Sung

(10) Patent No.: US 8,599,358 B2
(45) Date of Patent: Dec. 3, 2013

(54) MASKLESS EXPOSURE APPARATUSES AND FRAME DATA PROCESSING METHODS THEREOF

(75) Inventor: Jeong Hyoun Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 341 days.

(21) Appl. No.: 12/926,989

(22) Filed: Dec. 22, 2010

(65) Prior Publication Data

US 2011/0170081 A1 Jul. 14, 2011

(30) Foreign Application Priority Data

Jan. 11, 2010 (KR) .......................... 10-2010-0002105

(51) Int. Cl.
*G03B 27/54* (2006.01)
*G03B 27/32* (2006.01)

(52) U.S. Cl.
USPC .............................................. 355/67; 355/77

(58) Field of Classification Search
USPC ............ 355/53, 55, 67–71, 77; 359/855, 291, 359/292
See application file for complete search history.

(56) References Cited

U.S. PATENT DOCUMENTS

| 6,312,134 B1 * | 11/2001 | Jain et al. ...................... 359/855 |
| 7,907,770 B2 * | 3/2011 | Yang et al. ..................... 382/144 |
| 2006/0012766 A1 * | 1/2006 | Klosner et al. .................. 355/67 |

* cited by examiner

*Primary Examiner* — Hung Henry Nguyen
(74) *Attorney, Agent, or Firm* — Harness, Dickey & Pierce, P.L.C.

(57) ABSTRACT

Example embodiments are directed to a maskless exposure apparatus to efficiently process frame data of a Digital Micromirror Device (DMD) and a frame data processing method thereof. The frame data includes data obtained when a reference pixel of a virtual mask of the DMD and subsequent pixels of the virtual mask of the DMD, each of said subsequent pixels having an exposure time succeeding an exposure time of the reference pixel, are located on the same line. The generated frame data is selectively time-delayed and is changed to exposure frame data, and a pattern is exposed on a substrate using the exposure frame data.

18 Claims, 7 Drawing Sheets

FIG. 5

|  | Frame1 | Frame2 | Frame3 |
|---|---|---|---|
| $A_1$ | 1 | 1 | 1 |
| $A_2$ | 0 | 1 | 1 |
| $A_3$ | 0 | 0 | 0 |
| $A_4$ | 0 | 1 | 1 |
| $B_1$ | 1 | 1 | 1 |
| $B_2$ | 1 | 1 | 1 |
| $B_3$ | 0 | 0 | 0 |
| $B_4$ | 1 | 1 | 1 |
| $C_1$ | 1 | 1 | 1 |
| $C_2$ | 1 | 1 | 1 |
| $C_3$ | 0 | 0 | 0 |
| $C_4$ | 0 | 0 | 0 |
| $D_1$ | 1 | 1 | 1 |
| $D_2$ | 1 | 1 | 1 |
| $D_3$ | 0 | 0 | 0 |
| $D_4$ | 0 | 0 | 0 |
| $E_1$ | 1 | 1 | 1 |
| $E_2$ | 1 | 1 | 1 |
| $E_3$ | 0 | 0 | 0 |
| $E_4$ | 0 | 0 | 0 |
| $F_1$ | 0 | 0 | 0 |
| $F_2$ | 0 | 0 | 0 |
| $F_3$ | 0 | 0 | 0 |
| $F_4$ | 0 | 0 | 0 |

US 8,599,358 B2

MASKLESS EXPOSURE APPARATUSES AND FRAME DATA PROCESSING METHODS THEREOF

CROSS-REFERENCE TO RELATED APPLICATION

This application claims priority under 35 U.S.C. §119 to Korean Patent Application No. 10-2010-0002105, filed on Jan. 11, 2010 in the Korean Intellectual Property Office, the entire disclosure of which is incorporated herein by reference.

BACKGROUND

1. Field

Example embodiments relate to a maskless exposure apparatus to efficiently process frame data of a Digital Micro-mirror Device (DMD) and a frame data processing method thereof.

2. Description of the Related Art

In general, in a method of forming a pattern on a substrate included in a flat panel display such as a liquid crystal display or a plasma display panel, the substrate is coated with a pattern material, the pattern material is selectively exposed using a photomask, a pattern material portion having modified chemical properties or the other portion is selectively removed, thereby forming the pattern.

As the size of a substrate is increased and a pattern formed on an exposed surface becomes more precise, manufacturing costs of a photomask are increased. However, since a maskless exposure apparatus does not use a photomask, costs may be reduced.

A maskless exposure apparatus forms a pattern by irradiating a light beam onto a substrate with pattern information composed of an electrical signal using an electronic device. Representative examples of the electronic device include a Digital Micro-mirror Device (DMD). In a DMD, a plurality of micro mirrors send light beams having a predetermined/desired angle of incidence at a desired angle and send the other light beams at another angle so as to form a pattern on the exposed surface using only the necessary/required light beams.

In a maskless exposure apparatus using a DMD, when a stage which moves a substrate is scanned at a constant speed in an exposure direction, a pattern image (a virtual mask in maskless exposure) to be exposed at a constant interval is compared with pixel positions of the DMD, thereby forming a frame. That is, when a pixel of the DMD overlaps an exposure pattern, a micro mirror corresponding to that pixel is set to an ON state and, when a pixel of the DMD does not overlap an exposure pattern, a micro mirror corresponding to that pixel is set to an OFF state. Thus, all pixels (for example, 1024×768 pixels) of one frame are set to the ON or OFF state so as to generate frame data.

In order to expose a 3 μm line and space pattern in consideration of a takt time of an exposure apparatus, frame data needs to be generated at a speed of 50,000 frame/sec. Therefore, a high data processing speed of 40 Gbps is required.

In large-area exposure, a glass state may be changed according to layers of a substrate. Therefore, if frame data correction is demanded upon exposure, the demand needs to be immediately satisfied.

Conventionally, an offline method of generating frame data in advance, transmitting the frame data to a DMD and performing exposure was used. However, in the conventional offline method, it may be difficult to immediately correct frame data. In addition, a correction method may become complicated.

SUMMARY

According to example embodiments, a frame data processing method of a maskless exposure apparatus includes comparing pixels of a virtual mask of a Digital Micro-mirror Device (DMD) with a pattern image and generating virtual frame data; and, upon exposure, selectively time-delaying the generated virtual frame data to change the virtual frame data to exposure frame data and transmitting the exposure frame data to the DMD.

According to example embodiments, the frame data processing method, further includes generating the virtual frame data including data obtained when a reference pixel of a virtual mask of the DMD and subsequent pixels of the virtual mask of the DMD, each of said subsequent pixels having an exposure time succeeding an exposure time of the reference pixel, are located on a same line.

According to example embodiments, the virtual frame data includes set values of the reference pixel and the subsequent pixels of the virtual mask of the DMD, and upon exposure, a size of the virtual mask used to generate the virtual frame data is less than that of a virtual mask.

According to example embodiments, the set value of the reference pixel of the virtual frame data is transmitted with a time delay as the exposure frame data.

According to example embodiments, the reference pixel is located on a first row of each column of pixels of the virtual mask.

According to example embodiments, the subsequent pixels are time-delayed such that the exposure times thereof succeed the exposure times of the reference pixel.

According to example embodiments, the subsequent pixels are time-delayed in the frame units.

According to example embodiments, a frame data processing method of a maskless exposure apparatus includes measuring a position of a stage; recognizing positions of a plurality of pixels of a virtual mask of a Digital Micro-mirror Device (DMD) according to relative positions of micro mirrors of the DMD corresponding to the position of the stage and comparing the recognized positions of the plurality of pixels with a pattern image; generating different virtual frame data for the pixels of the virtual mask that overlap the pattern image and for pixels of the virtual mask that do not overlap the pattern image; and driving the micro mirrors of the DMD based on exposure frame data obtained by selectively time-delaying the virtual frame data upon exposure so as to expose a pattern.

According to example embodiments, a maskless exposure apparatus includes a position measurement unit configured to measure a position of a stage; an exposure unit including a Digital Micro-mirror Device (DMD), the DMD configured to expose a pattern on a substrate on the stage; and a frame data provider configured to compare a plurality of pixels of a virtual mask of the DMD with a pattern image to generate virtual frame data and provide exposure frame data obtained by changing the virtual frame data to the exposure unit, wherein the plurality of pixels of the virtual mask include a reference pixel and subsequent pixels on a same line of the virtual mask, each of said subsequent pixels having an exposure time succeeding an exposure time of the reference pixel.

According to example embodiments, the frame data provider includes a comparator configured to output different data setting signals for the pixels of the virtual mask that overlap the pattern image and for the pixels of the virtual mask that do not overlap the pattern image; a virtual frame generator configured to generate the virtual frame data according to the data setting signals of the comparator; and a delay unit configured to selectively time-delay the virtual frame data to change the virtual frame data to the exposure frame data and to transmit the exposure frame data.

According to example embodiments, the comparator recognizes pixel positions of the DMD according to the position of the stage measured by the position measurement unit.

According to example embodiments, the delay unit transmits the reference pixel without time delay.

According to example embodiments, the delay unit time-delays the subsequent pixels such that the exposure times of the subsequent pixels succeeds the exposure time of the reference pixel.

According to example embodiments, the delay unit time-delays the subsequent pixels in the frame units.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 5 is a table showing the virtual frame data of FIG. 4;

DETAILED DESCRIPTION

Figure 1:
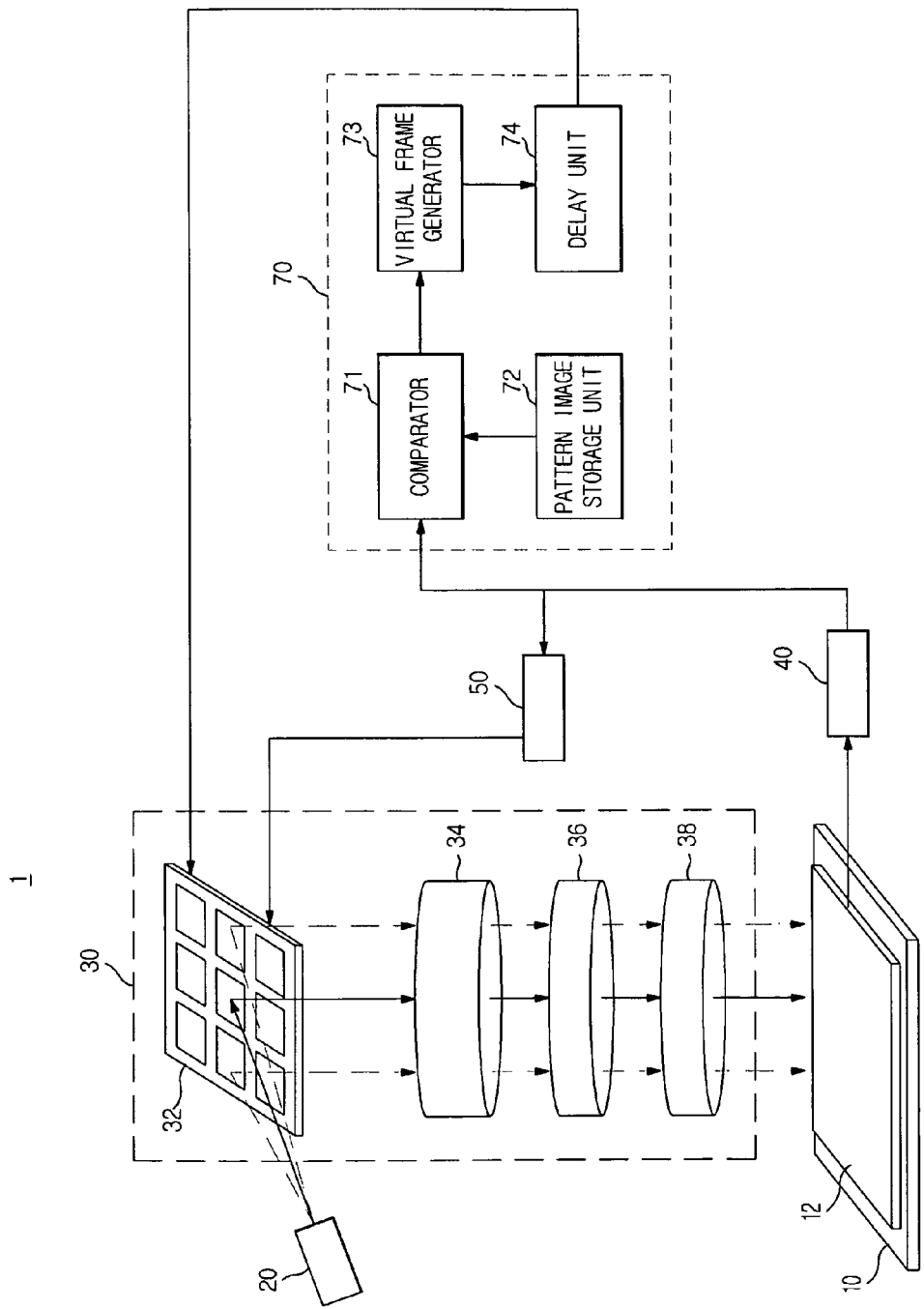
FIG. 1 is a diagram showing the configuration of a maskless exposure apparatus according example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a diagram showing the configuration of a maskless exposure apparatus according to example embodiments.

In FIG. 1, the maskless exposure apparatus 1 includes a stage 10, a light source 20, an exposure unit 30, a position measurement unit 40, a synchronization signal generator 50, and a frame data provider 70.

The stage 10 has a substrate 12 (an object on which a desired pattern will be formed, such as a wafer or glass) laid thereon, and moves in a scan direction parallel to an upper surface of the stage 10 such that light beams provided by the exposure unit 30 are scanned from one side to the other side of the substrate 12 along the surface of the substrate 12.

The light source 20 sends laser beams used for exposure to the exposure unit 30 and includes an optical system to adjust a semiconductor laser and the laser light beams emitted from the semiconductor laser.

The exposure unit 30 modulates the laser light beams received from the light source 20 according to frame data (pattern information) so as to selectively irradiate the laser light beams onto the substrate 12. The exposure unit 30 includes Digital Micro-mirror Devices (DMDs) 32 to selectively irradiate light beams without using a separate mask, a first projection lens 34, a micro-lens array 36, and a second projection lens 38.

Each DMD 32 is configured by arranging a plurality of micro mirrors, angles of which are adjustable. By differently setting the angles of the micro mirrors, light beams with a predetermined/desired angle of incidence are sent at a desired angle and the other light beams are sent at another angle. Thus, the light beams are selectively reflected according to the frame data.

The light beams reflected from the DMDs 32 pass through the first projection lens 34 provided below the DMDs 32 so as to increase the size of the light beams, the light beams passing through the first projection lens 34 pass through the micro-lens array 36 provided below the first projection lens 34 so as to adjust the size of the light beams to a predetermined/desired size, and the light beams passing through the micro-lens array 36 pass through the second projection lens 38 provided below the micro-lens array 36 so as to adjust the resolution of the light beams, thereby being irradiated onto the substrate 12.

The position measurement unit 40 monitors movement of the stage 10 so as to measure the position of the stage 10 moved at a scan position interval using a linear scaler and/or a laser interferometer. The positional signal is generated in the form of a pulse signal or a sine-wave signal, is generated at a constant interval according to the movement of the stage 10, and is transmitted to the synchronization signal generator 50 and the frame data provider 70.

The synchronization signal generator 50 receives the positional signal from the position measurement unit 40 and generates synchronization signals PEG to control driving time points of the DMDs 32, that is, frame switching of the DMDs 32. The synchronization signal generator 50 generates a plurality of synchronization signals equal to the number of the DMDs 32, distributes the plurality of synchronization signals PEG, and transmits one synchronization signal PEG to each of the DMDs 32. The plurality of synchronization signals PEG have the same period, but have different phase differences. The plurality of synchronization signals PEG having the same period and the different phase differences is respectively transmitted to the DMDs 32 so as to be used to control the driving time points of the DMDs 32, that is, frame switching of the DMDs 32.

The synchronization signals PEG are pulse signals synchronized with the frame switching of the DMDs 32 and are generated at constant positions along the scan direction of the stage 10, and the frames of the DMDs 32 are synchronously switched so as to perform exposure.

Figure 2:
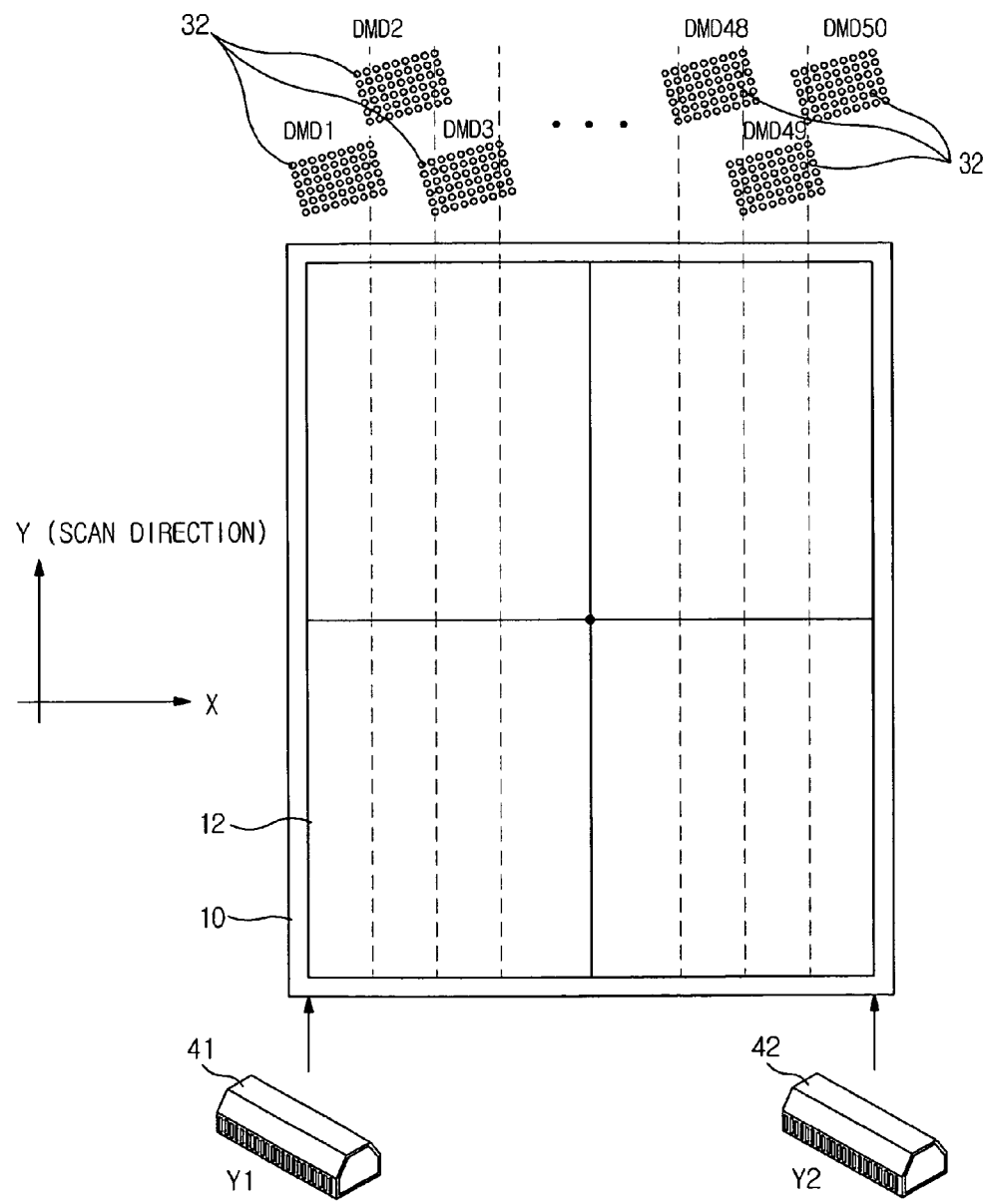
FIG. 2 is a diagram illustrating a pattern exposing operation of a maskless exposure apparatus according to example embodiments.

In FIG. 2, the substrate 12 is laid on the upper surface of the stage 10 and the stage 10 is moved in the scan direction (Y-axis direction) on a plane parallel to the upper surface thereof.

An array of DMDs 32 to irradiate the light beams onto the substrate 12 is provided above the stage 10. The array of the DMDs 32 is used to increase an exposure area and includes a plurality of DMDs 32. That is, the plurality of DMDs 32 is aligned in a line along a Y axis of the stage 10. The DMDs DMD1 and DMD2 are alternately arranged in the alignment direction of the DMDs 32.

According to example embodiments, a head having 50 DMDs 32 (DMD 1 to DMD 50) mounted therein is used for exposing eighth-generation (8G) glass by one scanning process. The number of DMDs 32 is not limited thereto and may be changed according to the exposure area and/or the size of the stage 10.

The position measurement unit 40 to monitor the movement of the stage 10 and to measure the position of the stage 10 moved at the scan position interval is provided adjacent to the stage 10. The position measurement unit 40 may include first and second laser interferometers 41 and 42 to measure two positions Y1 and Y2 in order to control the yaw of the stage 10. By such position measurement, the left and the right sides of the stage 10 may be controlled. The position of position measurement unit 40 is not limited to being adjacent to the stage 10, but can be at any location that facilitates monitoring of the movement and measurement of the position of the stage 10.

The frame data provider 70 includes a comparator 71, a pattern image storage unit 72, a virtual frame generator 73, and a delay unit 74.

The frame data provider 70 receives information about a pattern image to be formed on the substrate 12 from a user and provides frame data to the DMDs 32.

Figure 3:
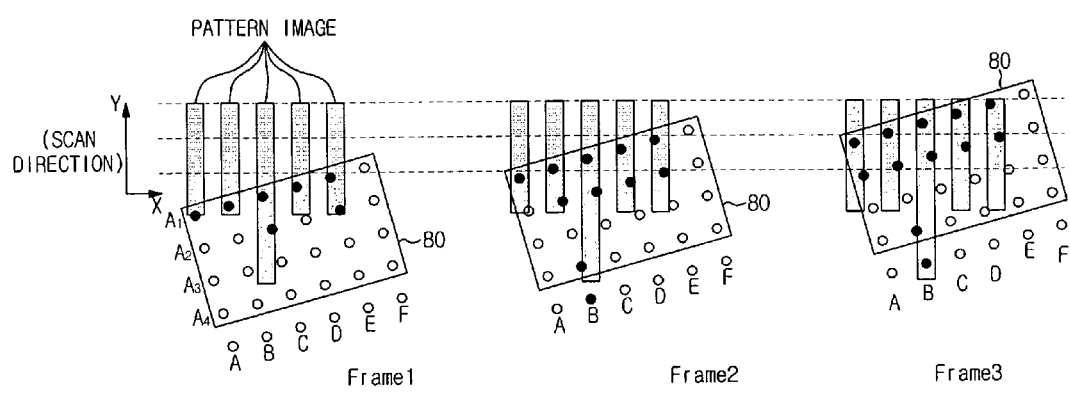
FIG. 3 is a diagram illustrating exposure frame data applied upon actual exposure according to example embodiments.

As shown in FIG. 3, in order to expose the pattern image, frame data of a virtual mask 80 of the DMDs 32 is generated in correspondence with the pattern image.

For example, among pixels of the virtual mask 80 corresponding to a first frame Frame1, black pixels overlapping a line-shaped pattern image are set to "1" and white pixels not overlapping the line-shaped pattern image are set to "0". The pixels of columns A, B, C, D, E and F of the virtual mask 80 are arranged to be tilted from the pattern image at a constant angle and the pixels are arranged in each column such that spaces between pixels of a front row are filled by pixels of a next row, thereby increasing resolution. A second frame Frame2 may be generated next to the first frame Frame1 and a third frame Frame3 may be generated next to the second frame Frame2, by the position change according to the movement of the stage 10.

However, as shown in FIG. 3, the frame data of the virtual mask 80 includes not only the line-shaped pattern image but also a portion excluding the line-shaped pattern image, that is, a pattern image corresponding to a space.

As the size of a portion occupied by the virtual mask 80 is increased, time required for generating the frame data is increased. That is, according to a method of comparing the entire region of the pattern image with the pixels of the virtual mask 80 so as to generate frame data, considerable time is required for generating the frame data.

Figure 4:
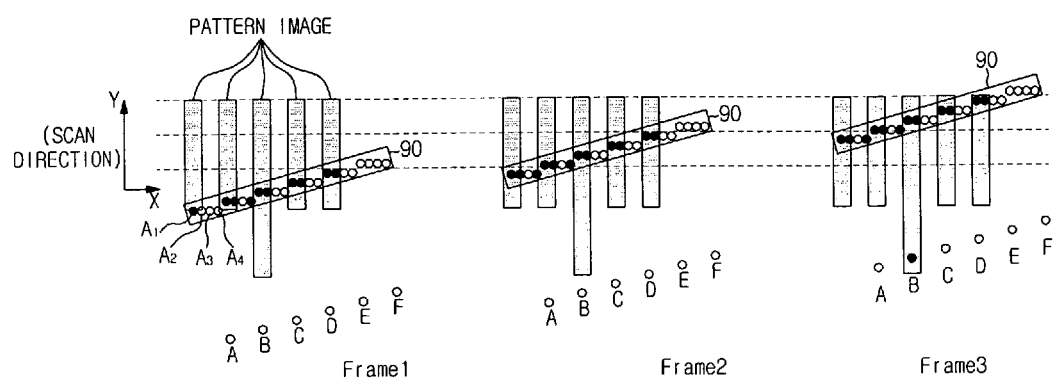
FIG. 4 is a diagram illustrating generation of virtual frame data according to example embodiments.

In FIG. 4, pixels of first rows of the columns of a virtual mask 90 are exposed at similar time points so as to form the pattern, but pixels of rows located subsequent to the first rows are exposed on the same line after a predetermined/desired time elapses so as to form the pattern. For example, if it is assumed that the pixels $A_1$, $A_2$, $A_3$ and $A_4$ of a column A are exposed on the same line at a certain moment in a horizontal direction of the reference pixel $A_1$, the size of the virtual mask 90 is significantly reduced. If the size of the virtual mask 90 is reduced, the size of the pattern image corresponding to the portion occupied by the virtual mask 90 which will be compared with the pixels of the virtual mask 90 is also reduced.

In FIG. 4, in the pixels of the columns, it is assumed that the subsequent pixels are located on the same line as the reference pixels $A_1$, $B_1$, $C_1$, $D_1$, $E_1$ and $F_1$. On such assumption, the comparator 71 compares the relative positions of the micro mirrors of the DMDs 32 corresponding to the stage position provided by the position measurement unit 40, for example, the pixel positions of the virtual mask 90, with the pattern image stored in the pattern image storage unit 72, and provides a data setting signal to set pixels overlapping the line-shaped pattern image to "1" and to set pixels not overlapping the line-shaped pattern image to "0" to the virtual frame generator 73.

The virtual frame generator 73 generates virtual frame data according to the data setting signal provided by the comparator 71. As such, virtual frame data, as can be seen from a table shown in FIG. 5, the column A of the virtual mask 90 of the first frame Frame1 is set to "1000", the column B thereof is set to "1101", the column C thereof is set to "1100", the column D thereof is set to "1100", the column E thereof is set to "1100", and the column F thereof is set to "0000". Similarly, the column A of the virtual mask 90 of the second frame Frame2 is set to "1101", the column B thereof is set to "1101", the column C thereof is set to "1100", the column D thereof is set to "1100", the column E thereof is set to "1100", and the column F thereof is set to "0000". The column A of the virtual mask 90 of the third frame Frame3 is set to "1101", the column B thereof is set to "1101", the column C thereof is set to "1100", the column D thereof is set to "1100", the column E thereof is set to "1100", and the column F thereof is set to "0000".

Figure 6:
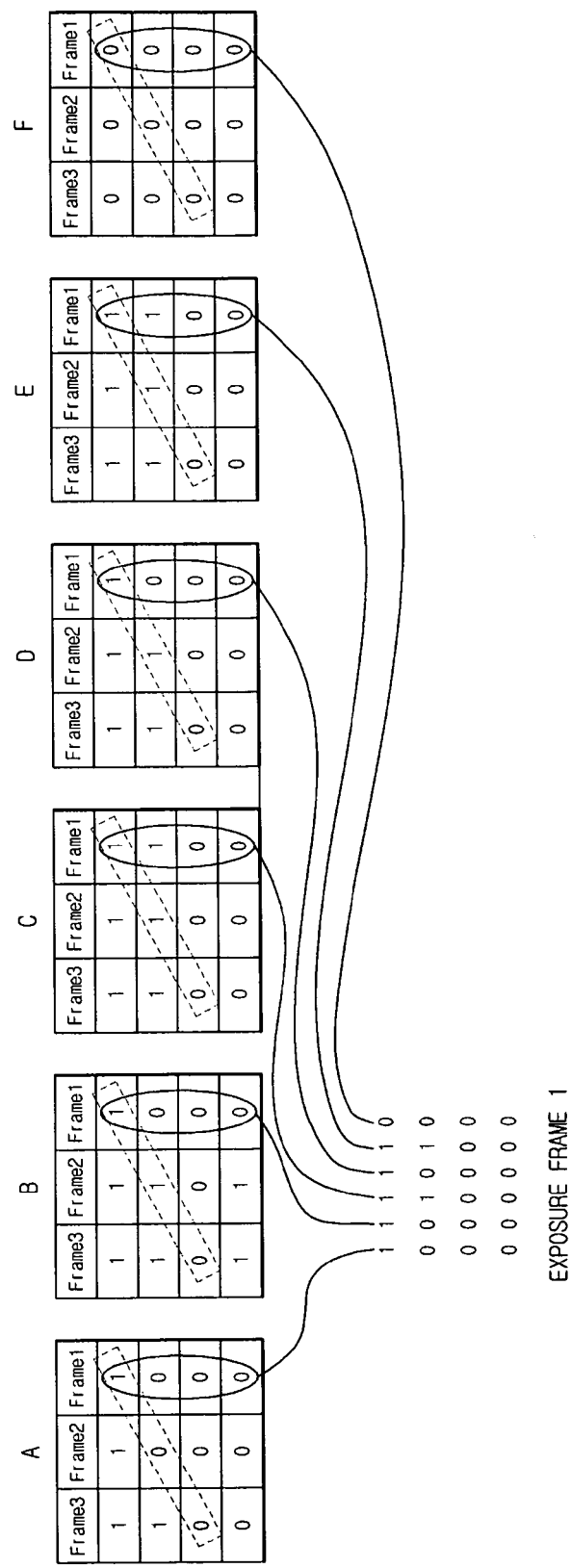
FIG. 6 is a diagram illustrating exposure frame data used upon exposure by time-delaying the virtual frame data of FIG. 4.
Figure 7:
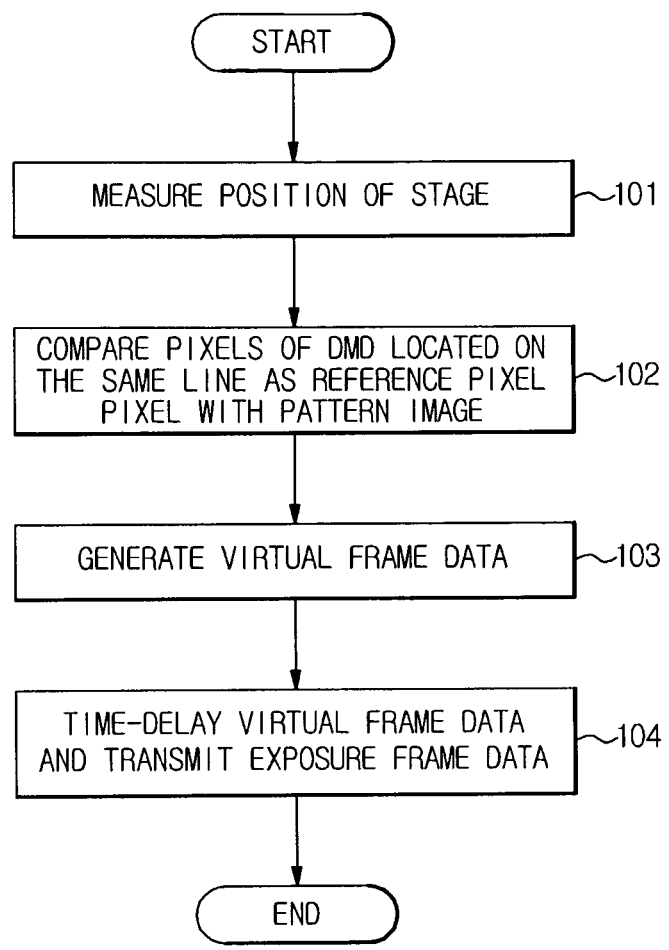
FIG. 7 is a flowchart illustrating a frame data processing method of a maskless exposure apparatus according to example embodiments.

The delay unit 74 changes the virtual frame data to exposure frame data necessary for exposure as frame data applied to the micro mirrors of the DMDs 32 as shown in FIG. 3, and transmits the exposure frame data to the exposure unit 30. The virtual frame data surrounded by dotted lines in FIG. 6 is time-delayed in the frame units and then is transmitted. The set value "1" of the reference pixel $A_1$ of the column A is transmitted without delay and, at this time, the set values of the other pixels $A_2$, $A_3$ and $A_4$ of the column A are "0". Similarly, the set values "1", "1", "1", "1" and "0" of the reference pixels of the other columns B, C, D, E, and F are transmitted without delay.

The delay unit 74 delays the set value "0" of the subsequent pixel $A_2$ of the column A by one frame and transmits the delayed set value, and delays the set value "0" of the subsequent pixel $A_3$ of the column A by two frames and transmits the delayed set value.

The delay unit 74 transmits the exposure frame data obtained by adequately time-delaying the subsequent pixels using the virtual frame data of each column to the exposure unit 30.

The exposure unit 30 drives the micro mirrors of the DMDs 32 using the exposure frame data according to the synchronization signals PEG provided by the synchronization signal generator 50, and exposes the pattern on the substrate 12.

Hereinafter, a frame data processing method of a maskless exposure apparatus according to example embodiments will be described.

After the substrate 12 is laid on the upper surface of the stage 10, the position measurement unit 40 measures the position of the stage 10 moved in scan position intervals in the scan direction (101). The position measurement result is transmitted to the synchronization signal generator 50 and the frame data provider 70.

Assuming that the subsequent pixels are located on the same line as the reference pixels $A_1$, $B_1$, $C_1$, $D_1$, $E_1$ and $F_1$ in the pixels of the columns, the comparator 71 of the frame data provider 70 recognizes the relative positions of the micro mirrors of the DMDs 32 corresponding to the stage position provided by the position measurement unit 40, for example, the pixel positions of the virtual mask 90, compares the pixel positions with the pattern image stored in the pattern image storage unit 72, and provides the data setting signal to set the pixels overlapping the line-shaped pattern image to "1" and to set the pixels not overlapping the line-shaped pattern image to "0" to the virtual frame generator 73 (102).

The virtual frame generator 73 generates the virtual frame data with respect to the columns according to the data setting signal of the comparator 71 as shown in FIG. 5 and outputs the generated virtual frame data to the delay unit 74 (103).

The delay unit 74 changes the virtual frame data to the exposure frame data to drive the micro mirrors of the DMDs 32 upon exposure and transmits the exposure frame data to the exposure unit 30. At this time, the set values of the reference pixels of the columns are transmitted without delay and the set values of the subsequent pixels are delayed in the frame units and are then transmitted (104).

According to example embodiments, since low-capacity virtual frame data is generated on the assumption that reference pixels and subsequent pixels of a virtual mask are located on the same line at a certain moment, the virtual frame data is changed to exposure frame data, and the exposure frame data is transmitted to an exposure unit upon actual exposure, a memory access time associated with generation of frame data is reduced. In addition, upon large-area exposure, it may be possible to immediately cope with a demand for correction.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A frame data processing method of a maskless exposure apparatus, the method comprising:
    comparing overlap of pixels of a virtual mask of a Digital Micro-mirror Device (DMD) with a pattern image to be formed on a substrate and generating virtual frame data; and
    upon exposure, selectively time-delaying a portion of pixels among a plurality of pixels of the generated virtual frame data to change the virtual frame data to exposure frame data and transmitting the exposure frame data to the DMD.

2. The method of claim 1, further comprising:
    generating the virtual frame data including data obtained when a reference pixel of the virtual mask of the DMD and subsequent pixels of the virtual mask of the DMD are located on a same line;
    wherein each of the subsequent pixels have an exposure time succeeding an exposure time of the reference pixel.

3. The method of claim 2, wherein the virtual frame data includes set values of the reference pixel and the subsequent pixels of the virtual mask of the DMD, and
    wherein upon exposure, a size of a portion of the virtual mask used to generate the virtual frame data is less than that of the virtual mask.

4. The method of claim 3, wherein the set value of the reference pixel of the virtual frame data is transmitted with a time delay as the exposure frame data.

5. The method of claim 2, wherein for each column of pixels of the virtual mask, the reference pixel is located on a first row of the column of pixels of the virtual mask.

6. The method of claim 2, wherein the subsequent pixels are time-delayed such that the exposure times of the subsequent pixels succeed the exposure times of the reference pixel.

7. The method of claim 6, wherein the subsequent pixels are time-delayed in frame units.

8. A frame data processing method of a maskless exposure apparatus, the method comprising:
    measuring a position of a stage;
    recognizing positions of a plurality of pixels of a virtual mask of a Digital Micro-mirror Device (DMD) according to relative positions of micro mirrors of the DMD corresponding to the position of the stage and comparing the recognized positions of the plurality of pixels with a pattern image to be formed on a substrate;
    generating different virtual frame data for the pixels of the virtual mask that overlap the pattern image and for the pixels of the virtual mask that do not overlap the pattern image; and
    driving the micro mirrors of the DMD based on exposure frame data obtained by selectively time-delaying a portion of pixels among a plurality of pixels of the generated virtual frame data upon exposure so as to expose a pattern.

9. The method of claim 1, further comprising:
measuring a position of a stage of the maskless exposure apparatus.

10. The method of claim 9, further comprising:
recognizing positions of the plurality of pixels of the virtual mask according to the position of the stage.

11. The method of claim 2, further comprising:
transmitting the virtual frame data of the reference pixel of the virtual mask without time delay.

12. The method of claim 1, wherein for each column of pixels of the virtual mask, subsequent pixels of the column have exposure times succeeding an exposure time of a reference pixel of the column.

13. The method of claim 1, wherein the pixels of the virtual mask are arranged to be tilted from the pattern image at a constant angle, and
wherein the tilting at the constant angle increases resolution of the maskless exposure apparatus.

14. A frame data processing method of a maskless exposure apparatus, the method comprising:
comparing overlap of reference pixels and subsequent pixels of a virtual mask of a Digital Micro-mirror Device (DMD) with a pattern image to be formed on a substrate;
generating virtual frame data based on the comparing of overlap of the reference pixels and the subsequent pixels of the virtual mask;
time-delaying generated virtual frame data of the subsequent pixels of the virtual mask, relative to generated virtual frame data of the reference pixels of the virtual mask, to change the generated virtual frame data to exposure frame data; and
transmitting the exposure frame data to the DMD;
wherein the pixels of the virtual mask are arranged to be tilted from the pattern image at a constant angle.

15. The method of claim 14, wherein the reference pixels are located on a first row of each column of pixels of the virtual mask.

16. The method of claim 14, wherein the subsequent pixels of the virtual mask have exposure times succeeding exposure times of the reference pixels of the virtual mask.

17. The method of claim 14, wherein for each column of pixels of the virtual mask, the subsequent pixels of the column have exposure times succeeding an exposure time of the reference pixel of the column.

18. The method of claim 14, wherein the tilting at the constant angle increases resolution of the maskless exposure apparatus.

* * * * *